(12) United States Patent
Miyabe

(10) Patent No.: US 6,351,149 B1
(45) Date of Patent: Feb. 26, 2002

(54) MOS TRANSISTOR OUTPUT CIRCUIT

(75) Inventor: Satoru Miyabe, Matsudo (JP)

(73) Assignee: Nippon Precision Circuits, Inc., Tokyo (JP)

( * ) Notice: Subject to any disclaimer, the term of this patent is extended or adjusted under 35 U.S.C. 154(b) by 0 days.

(21) Appl. No.: 09/454,118

(22) Filed: Dec. 3, 1999

(30) Foreign Application Priority Data

Dec. 4, 1998 (JP) ............................................ 10-345757

(51) Int. Cl.$^7$ .......................................... H03K 19/0175
(52) U.S. Cl. ............................. 326/87; 326/76; 326/77
(58) Field of Search .............................. 326/26, 27, 83, 326/86, 87

(56) References Cited

U.S. PATENT DOCUMENTS

| | | | | |
|---|---|---|---|---|
| 5,122,690 A | * | 6/1992 | Bianchi | 307/475 |
| 5,751,160 A | * | 5/1998 | Baek et al. | 326/27 |
| 6,066,958 A | * | 5/2000 | Taniguchi et al. | 326/27 |

FOREIGN PATENT DOCUMENTS

JP 6-318710 11/1997

* cited by examiner

*Primary Examiner*—Michael Tokar
(74) *Attorney, Agent, or Firm*—Schulte Roth & Zabel; Joel E. Lutzker; Donna L. Angotti

(57) ABSTRACT

There is disclosed a MOS transistor output circuit capable of suppressing ringing and other noises and of operating at high speed under low power supply voltages. A signal corresponding to an input signal is applied to the gates of a first p-channel MOS transistor and a first n-channel MOS transistor. A control circuit detects the falling edge of the input signal to create a first signal. A second p-channel MOS transistor is held in conduction by the first signal during a period beginning with the rising edge of the output signal and ending with the instant at which the output signal can be regarded as having logic high (H) level. The rising edge of the input signal is detected to create a second signal. A second n-channel MOS transistor is held in conduction by the second signal during a period beginning with the falling edge of the output signal and ending with the instant at which the output signal can be regarded as having logic low (L) level.

4 Claims, 4 Drawing Sheets

MOS TRANSISTOR OUTPUT CIRCUIT

BACKGROUND OF THE INVENTION

The present invention relates to a MOS transistor output circuit. CMOS inverters have been heretofore used as output circuits of semiconductor integrated circuits of CMOS configuration. In such a configuration, if a large capacitive load exists at the output terminal, or if a number of output circuits operate simultaneously, noises such as ringing and ground bounces present problems. Ringing noises in an output circuit are caused by the fact that a rapid switching current due to rising and falling edges of signal flows through a resonant circuit consisting of an L-component, output transistors, and capacitive loads. The L-component is due to bonding wires at the output terminal. The ground bounces are caused by a counter electromotive force induced by flow of the aforementioned switching current through bonding wires at the power-supply terminals.

One conventional countermeasure against these noises is to use a method consisting of dividing output transistors in parallel and turning them on in turn to alleviate the rapid increase of the switching current. This configuration is shown in FIG. 6, where a CMOS inverter consisting of a p-channel MOS transistor 61 and an n-channel MOS transistor 62 has an output terminal OUT. These transistors 61 and 62 act as output transistors. There are other output transistors 63 and 64 whose drains are connected with the output terminal OUT of the CMOS inverter. The transistor 63 is a p-channel MOS transistor, while the transistor 64 is an n-channel MOS transistor. Thus, the p-channel output transistors are divided into the MOS transistors 61 and 63. The n-channel output transistors are divided into the MOS transistors 62 and 64. Signals applied to the gates of the p-channel MOS transistor 61 and n-channel MOS transistor 62 are delayed by delay circuits 65 and 66, respectively, and supplied to the gates of the MOS transistors 63 and 66, respectively. The p-channel MOS transistor 63 and n-channel transistor 64 are turned on and off in a delayed manner compared with the MOS transistors 61 and 62.

In another available method, the output transistors are divided in parallel, and the output transistors are turned off in a stepwise fashion according to the state of the output. This reduces rapid decrease of the switching current. A configuration implementing this method is constructed as shown in FIG. 7, where a CMOS inverter has output transistors 71 and 72. The transistor 71 consists of a p-channel MOS transistor, while the transistor 72 consists of an n-channel MOS transistor. The CMOS inverter further includes output transistors 73 and 74 whose drains are connected with the output terminal OUT of the CMOS transistor. The transistor 73 is a p-channel MOS transistor, whereas the transistor 74 is an n-channel MOS transistor. The MOS transistors 73 and 74 are connected with power-supply terminals VDD and VSS, respectively, via a p-channel MOS transistor 75 and an n-channel MOS transistor 76, respectively. The gates of the MOS transistors 75 and 76 are connected with the output terminal. The MOS transistors 73 and 74 are turned on simultaneously with the MOS transistors 71 and 72, respectively. This inverts the output signal. In response to this, the MOS transistors 75 and 76 are turned off. As a result, the MOS transistors 73 and 74 are cut off.

One configuration in which output transistors are divided in parallel and turned off in a stepwise fashion according to the state of the output is described in Japanese Unexamined Patent Publication No. 249974/1995 and shown in FIG. 8.

This circuitry includes output transistors P1, P2, N1, N2, as well as p-channel MOS transistors P3–P7 and n-channel MOS transistors N3–N7 for controlling signals applied to the gates of the output transistors P1, P2, N1, and N2 in response to the state at the output terminal C. The transistors P1 and P2 are p-channel MOS transistors, while the transistors N1 and N2 are n-channel MOS transistors. Where the MOS transistors P1 and N1 have a large size, the MOS transistors P3, N3, P4, and N4 have a medium size, the MOS transistors P2, N2, P5, and N5 have a small size, and the MOS transistors P6, N6, P7, and N7 have a very small size.

The prior art methods, although useful in reducing ringing noises and ground bounces in out put circuits, are inefficient or undesirable for one or more of the following reasons. For example, in the configuration shown in FIG. 6, the output transistors divided in parallel are turned on and off in a stepwise manner. Therefore, the rising and fall speeds of the output signal are deteriorated. Hence, this configuration is not adapted for circuits to be operated at high speeds.

On the other hand, in the configuration shown in FIG. 7 the divided output transistors are turned on without time difference and so it is said that neither the rising speed nor the falling speed of the output signal decreases. In practice, however, the switching MOS transistors 75 and 76 used for feedback to the output transistors must be added in series. The resistive components of the added transistors decrease the rising and falling speeds of the output signal. Consequently, the configuration does not function efficiently especially at low power-supply voltages.

In the configuration shown in FIG. 8, a signal is fed back to the MOS transistor P1 from the output terminal C via the MOS transistors N4 and P6. The MOS transistor N4 is connected in series with the MOS transistor N3, forming a composite gate. If MOS transistors are connected in series, the threshold value of the MOS transistor N4 is increased by the substrate-bias effect. This reduces the capability of driving the following stage. To compensate for this, the size of the transistors must be increased. The feedback to the MOS transistor P2 from the output terminal C is now compared with the case of the MOS transistor P1. Since the positions of the p-channel and n-channel transistors have been interchanged, the driving ability is lowered further. When the MOS transistor N3 turns on, the state of the output signal from the output terminal C varies. Thus, the MOS transistors N4 and P5 are making a transition from ON to OFF or vice versa. This means that the MOS transistors N4 and P5 are in a state of low driving ability. Hence, sufficient use of the driving ability of the previous stage of MOS transistor N3 cannot be made. This makes it difficult to operate the final stage of MOS transistors P1 and P2 at high speeds. Therefore, the size needs to be increased further to secure the necessary driving ability. In the same way as the configuration shown in FIG. 7, the driving ability becomes insufficient, especially when the power-supply voltage is low. In this way, this configuration is not a practically effective means.

SUMMARY OF THE INVENTION

Accordingly, it is an object of the present invention to provide a MOS transistor output circuit that has no feedback portion in its output stage and is capable of operating at high speed under lower power-supply voltages.

In a MOS transistor output circuit in accordance with the present invention, two output transistors are provided for the p-channel side and two output transistors are provided for the n-channel side. Thus, the output transistors are divided.

A signal corresponding to an input signal is applied to the gates of the first p-channel MOS transistor and the first n-channel MOS transistor. The rising edge and the falling edge of the input signal are detected to produce first and second signals. These first and second signals are applied to the gates of the second p-channel MOS transistor and the second n-channel MOS transistor, respectively, thus turning off the output transistors in turn. This suppresses noises such as ringing and ground bounces. Because of this configuration, the output section has no feedback portion. As a result, the MOS transistor output circuit can operate at higher speeds under lower power-supply voltages.

In one embodiment of the invention, the drain of the first p-channel MOS transistor is connected with the drain of the first n-channel MOS transistor to form an output terminal. The drains of the second p-channel MOS transistor and the second n-channel MOS transistor are connected to the output terminal described above. A certain signal such as an input signal or a signal corresponding to the inversion of the input signal is applied to the gates of the first p-channel MOS transistor and the first n-channel MOS transistor. For example, if the certain signal corresponds to the input signal, then the falling edge of the input signal is detected to generate the first signal, and the rising edge of the input signal is detected to generate the second signal. If the certain signal corresponds to the inverted signal, then the rising edge of the input signal is detected to generate the first signal and the falling edge of the input signal is detected to generate the second signal.

In operation, the first signal is applied to the gate of the second p-channel MOS transistor. A period starting with the rising edge of the output signal from the output terminal described above and ending when the logic level of the output signal can be regarded as high (H) is herein referred to as a first period. During this first period, the second p-channel MOS transistor is made to conduct. The second signal is applied to the gate of the second n-channel MOS transistor. A period starting with the falling edge of the output signal and ending when the logic level of the output signal can be regarded as low (L) is herein referred as a second period. During this second period, the second n-channel MOS transistor is made to conduct.

Preferably, the delay of the certain signal with respect to the input signal is made substantially equal to the delay of the first and second signals with respect to the rising or falling edge of the input signal.

Other objects and features of the invention will appear in the course of the description thereof, which follows.

DESCRIPTION OF THE PREFERRED EMBODIMENTS

Figure 1:
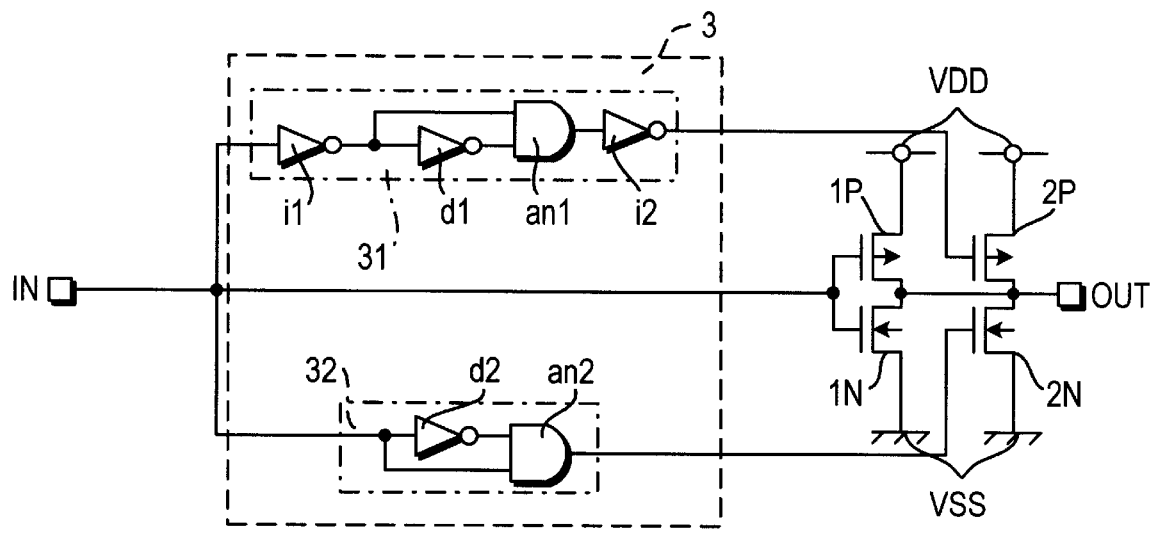
FIG. 1 is a circuit diagram of a MOS transistor output circuit in accordance with one embodiment of the present invention.

A MOS transistor output circuit in accordance with one embodiment of the present invention is first described by referring to FIG. 1. The drain of a first p-channel MOS transistor 1P is connected with the drain of a first n-channel MOS transistor 1N. The drain of a second p-channel MOS transistor 2P is connected with the drain of a second n-channel MOS transistor 2N. An output terminal OUT is formed across the junctions of the drains of the MOS transistors 1P, 1N, 2P, and 2N. The total driving ability of the first and second p-channel MOS transistors 1P, 2P is equal to the driving ability of p-channel MOS transistors forming a CMOS inverter that is a general output circuit which needs to exhibit a driving ability in the following stage. The total driving ability of the first and second n-channel MOS transistors 1N and 2N is also equal to the driving ability of n-channel MOS transistors forming the aforementioned CMOS inverter. That is, it can be said that the p-channel and n-channel MOS transistors having actually required driving abilities are divided into a p-channel pair of 1P, 2P and an n-channel pair of 1N, 2N. An input signal from an input terminal IN is supplied to the gates of the first p-channel MOS transistor 1P and the first n-channel MOS transistor 1N. A first signal and a second signal (described later) from a control circuit 3 are supplied to the gates of the second p-channel MOS transistor 2P and the second n-channel MOS transistor 2N, respectively.

The aforementioned control circuit 3 consists of a first detection portion 31 and a second detection portion 32. The first detection portion 31 detects the falling edge of the input signal and produces the first signal. The second detection portion 32 detects the rising edge of the input signal and produces the second signal. The first detection portion 31 comprises an inverter i1 receiving the input signal, a delay inverter d1 receiving the output from the inverter i1, an AND gate an1 receiving the outputs from the inverter i1 and the delay inverter d1, and an inverter i2 receiving the output from the AND gate an1. The output from the inverter i2 is the first signal described above. The second detection portion 32 consists of a delay inverter d2 receiving an input signal and an AND gate an2 receiving the input signal and the output from the delay inverter d2. The output from the AND gate an2 is the aforementioned second signal. The delay times of the delay inverters d1 and d2 are adjustable. The ON times of the second p-channel MOS transistor 2P and the second n-channel MOS transistor 2N are optimized.

Figure 2:
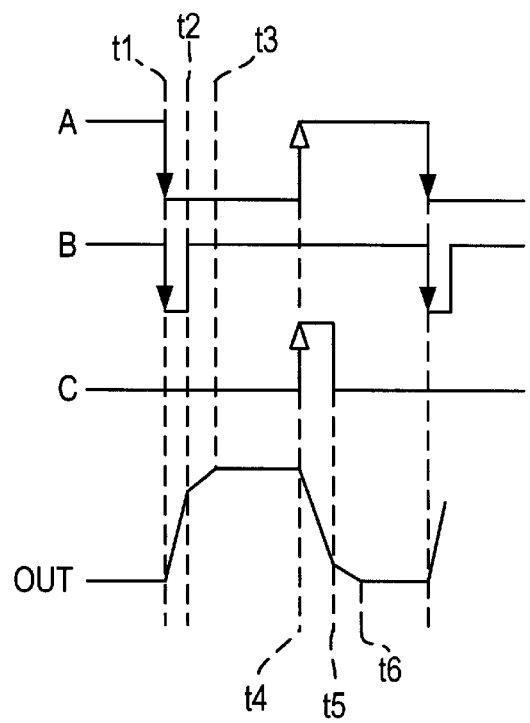
FIG. 2 is a waveform diagram illustrating the operation of the circuit shown in FIG. 1.

The operation of the present embodiment is next described. FIG. 2 is a waveform diagram illustrating the operation. A indicates the input signal to the input terminal IN of FIG. 1. B and C indicate first and second signals, respectively. The output signal from the output terminal OUT is indicated by OUT. When the output signal is making a transition from L to H, the first and second p-channel MOS transistors 1P, 2P are turned on and off in the manner described below.

The first p-channel MOS transistor 1P responds to a falling edge of the input signal and is turned on at instant t1. The output from the inverter i1 that is applied to one input terminal of the AND gate an1 falls in response to the falling edge of the input signal. This causes the output from the AND gate an1 to rise. The output from the inverter i2, i.e., the first signal, falls. In consequence, the second p-channel MOS transistor is turned on. The first p-channel MOS transistor 1P and the second p-channel MOS transistor 2P are turned on almost simultaneously. The driving ability of the output terminal OUT is equal to the total driving ability of the two p-channel MOS transistors 1P and 2P. This secures a rising speed necessary for the output signal.

At the next instant t2, the output signal has increased to a level that can be sufficiently regarded as H from the following stage. At this instant t2, the delay inverter d1 responds to the falling edge of the input signal with a given delay and causes the output signal to fall. As a result, the output from the AND gate an1 falls. In response to this, the output from the inverter i2, i.e., the first signal, rises. Consequently, the second p-channel MOS transistor 2P is turned off. This instant t2 is optimized by the delay inverter d1. The AND gate an1 is composed of a composite gate (not shown) having two inputs. A time difference is introduced between these two inputs to the AND gate an1 by the delay inverter d1. Therefore, when one operates, the driving ability is prevented from being hindered by the impedance of the other. This assures the stability of the operation when the power-supply voltage is low. Since the second p-channel MOS transistor 2P is turned off, the driving ability of the MOS transistor output circuit in accordance with the present embodiment decreases to the driving ability of the first p-channel MOS transistor 1P alone. The switching current decreases in one step at this time. This suppresses ringing noises.

At the next instant t3, the output voltage from the output terminal OUT has risen to the power-supply voltage. At this time, the voltage between the drain and the source of the first p-channel MOS transistor is almost zero. The first p-channel MOS transistor 1P no longer conducts. At this stage, the whole switching current becomes zero. The transition of the output signal from L to H ends.

Also when the output signal makes a transition from H to L, the first n-channel MOS transistor 1N and the second n-channel MOS transistor 2N are simultaneously turned on in the same manner as on the p-channel side. The second n-channel MOS transistor 2N is turned off earlier. This operation is briefly described. When the input signal rises at instant t4, the first p-channel MOS transistor is turned off, and the first n-channel MOS transistor 1N is turned on. In response to the rising edge of the input signal, the AND gate an2 raises its output signal, or the second signal. This turns on the second n-channel MOS transistor 2N. At the next instant t5, the output signal has dropped to a level that can be sufficiently recognized as low (L) from the following stage. At this instant t5, the delay inverter d2 responds to the rising edge of the input signal with a given delay and causes the signal to fall. As a result, the output from the AND gate an2 falls, i.e., the second signal falls. The second n-channel MOS transistor 2N is turned off. This suppresses noises such as ground bounces. At the next instant t6, the output voltage from the output terminal OUT has dropped to zero. The transition of the output signal from L to H ends.

Figure 3:
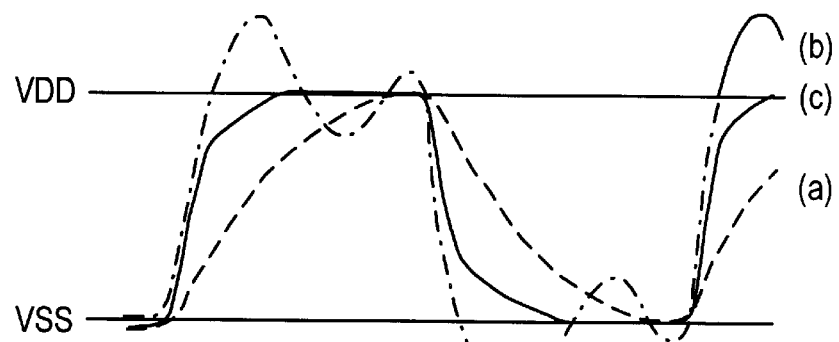
FIG. 3 is a waveform diagram illustrating the operation of the circuit shown in FIG. 1.

FIG. 3 compares the waveform obtained when the MOS transistor output circuit in accordance with the present embodiment is operated as described above with the waveform when the output circuit is not operated similarly. Curve (a) shows a waveform obtained when only the first p-channel MOS transistor 1P and the first n-channel MOS transistor 1N are turned on and off. In this case, no ringing is produced. However, neither sufficient rising speed nor sufficient falling speed can be secured.

Curve (b) in FIG. 3 shows a waveform obtained when the first and second p-channel MOS transistors 1P, 2P are simultaneously turned on and off and the first and second n-channel MOS transistors 1N, 2N are simultaneously turned on and off. In this case, it is possible to secure sufficient rising speed and sufficient falling speed, but ringing noises are produced.

Curve (c) in FIG. 3 shows a waveform obtained when the above-described operation in accordance with the present embodiment is performed. Sufficient rising speed and sufficient falling speed can be secured. Also, ringing noises can be suppressed.

As described thus far, in the present embodiment, the divided output transistors are both driven in the initial phase of the output signal rising. After the logic level of the output signal has reached to a level that can be regarded as H or L, only one of the output transistors is driven. Therefore, necessary rising speed and falling speed can be secured. Furthermore, it is possible to suppress ringing noises. The control of the output transistors described thus far is provided by detecting the falling and rising edges of the input signal by a control circuit, producing first and second signal, respectively, and using them. Therefore, the output section has no feedback portion. Consequently, higher-speed operation and lower supply voltage operation are enabled.

Figure 4:
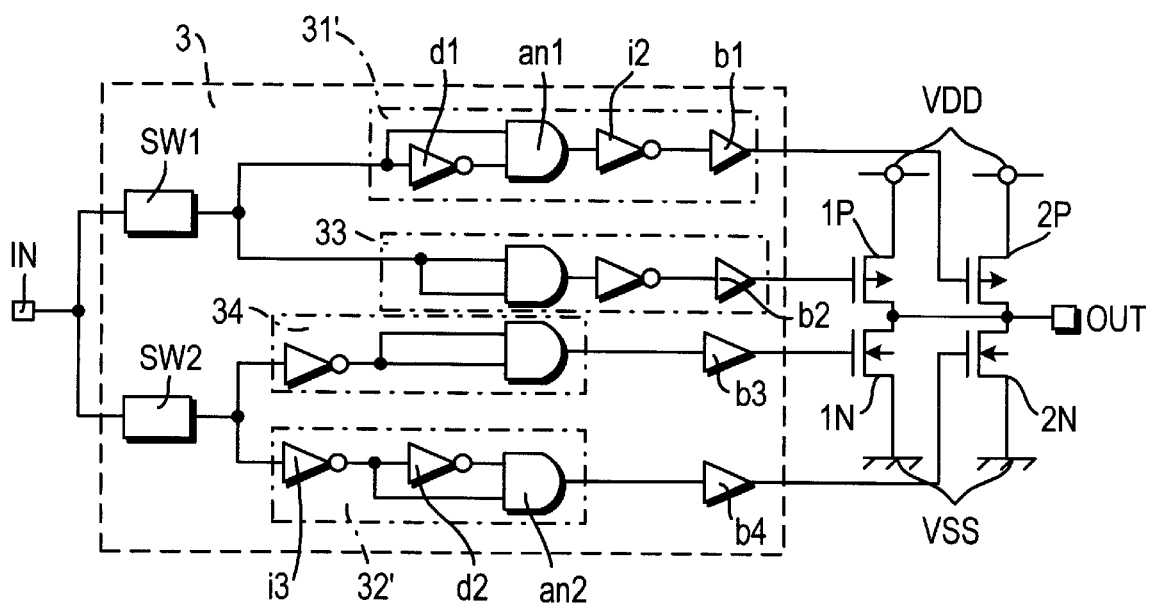
FIG. 4 is a circuit diagram of a MOS transistor output circuit in accordance with a second embodiment of the invention.

A MOS transistor output circuit in accordance with a second embodiment of the invention is next described by referring to FIG. 4. Note that like components are indicated by like reference numerals in both FIGS. 1 and 4. The MOS transistor output circuit in accordance with the first embodiment acts as an inverter for an input signal. The MOS transistor output circuit in accordance with the present embodiment acts as a converter. The output circuit shown in FIG. 4 has a control circuit 3', a first detection portion 31', and a second detection portion 32'. To accomplish the converter, the circuit is designed as follows. The first detection portion 31', is obtained by omitting the inverter i1 from the first detection portion 31 in the first embodiment. An inverter i3 is added to the input side of the second detection portion 32, forming the second detection portion 32'. The first detection portion 31', detects the rising edge of a signal applied to the input terminal IN and sets the output high (L). The second detection portion 32', detects the falling edge of the signal applied to the input terminal IN and sets the output high (H). The first and second detection portions 31', and 32' receive their inputs via switches SW1 and SW2, respectively, used to stop the output signal.

In the present embodiment, the first p-channel MOS transistor 1P is driven by a signal supplied via a delay circuit 33. This delay circuit 33 is formed by cascading an AND gate and an inverter which are similar in construction to the AND gate an1 and the inverter i2, respectively. The delay circuit inverts and delays its input signal. The amount of delay of the delay circuit 33 is made equal to the delay of the falling edge of the output signal from the first detection portion 31, with respect to the rising edge of the input signal. A signal passed through a delay circuit 34 drives the first n-channel MOS transistor 1N. The delay circuit 34 is formed by cascading an AND gate and an inverter which are similar in construction with the AND gate an2 and the inverter i3, respectively. The delay circuit 34 inverts and delays its input signal. The delay of the delay circuit 34 is made equal to the delay of the rising edge of the output signal from the second detection portion 32, with respect to the falling edge of the input signal. Also included are buffers b1–b4.

Since the operation of the output circuit in accordance with the present embodiment is similar to the operation of the output circuit in accordance with the first embodiment, the operation will not be described in detail below. The present embodiment is characterized in that the inserted switches SW1 and SW2 make it possible to control the p-channel and n-channel MOS transistors independently when the circuit is not in operation. During operation, the falling edge of the signal applied to the gate of the first p-channel MOS transistor 1P is exactly synchronized to the falling edge of the signal applied to the gate of the second p-channel MOS transistor 2P. The rising edge of the signal applied to the gate of the first n-channel MOS transistor 1N is exactly synchronized to the rising edge of the signal applied to the second n-channel MOS transistor 2N. Hence, the advantages of the first embodiment described above can be obtained with greater reliability.

Figure 5:
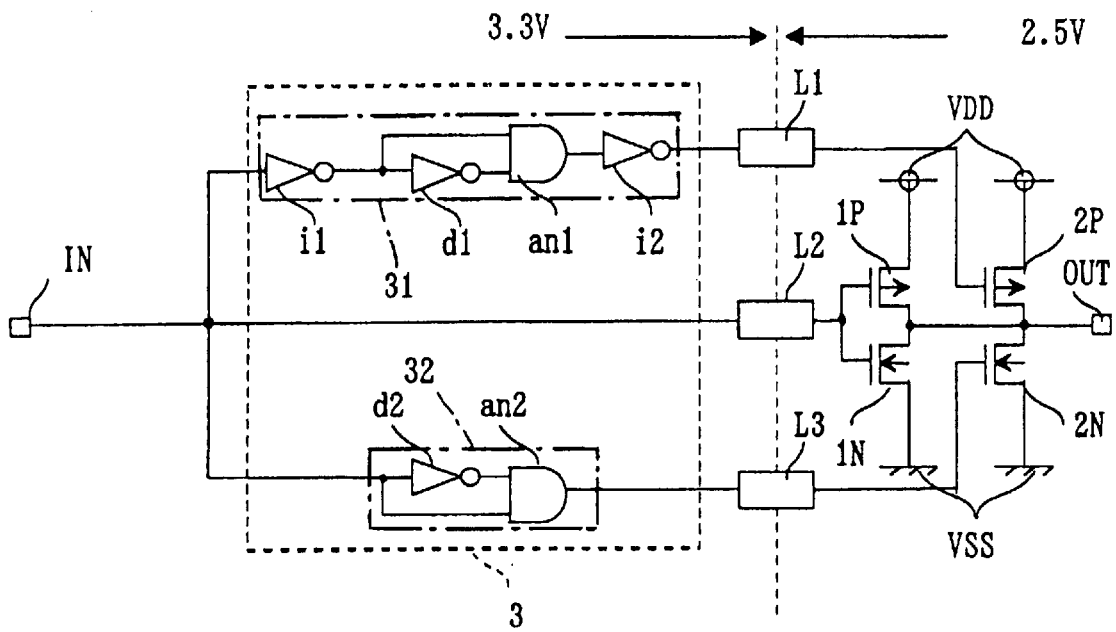
FIG. 5 is a circuit diagram of a MOS transistor output circuit in accordance with a third embodiment of the invention.
Figure 6:
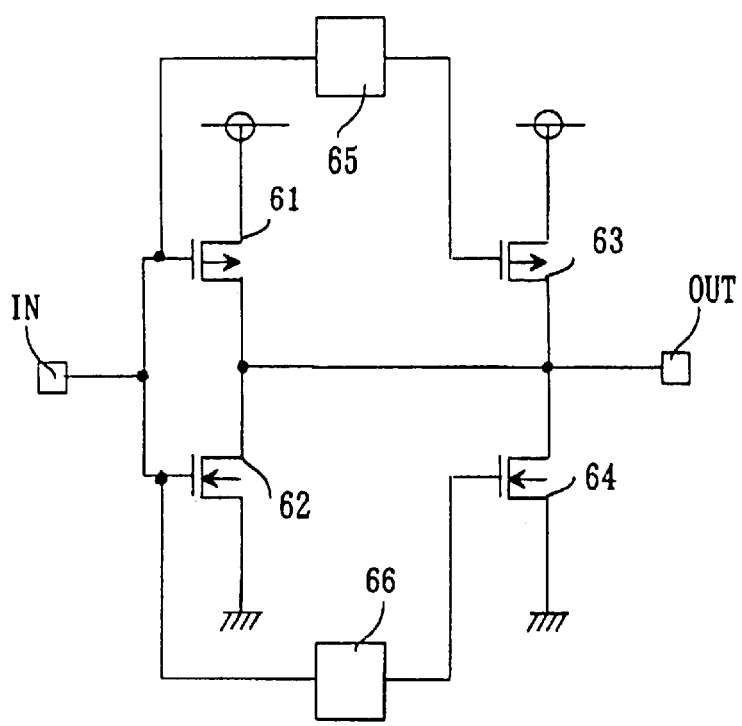
FIG. 6 is a circuit diagram of a prior art MOS transistor output circuit.
Figure 7:
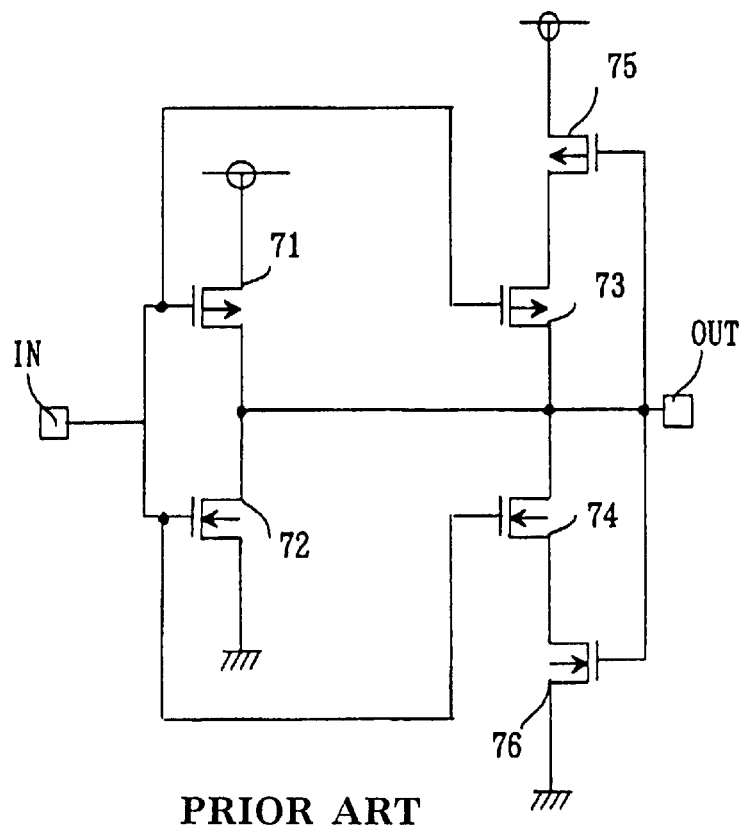
FIG. 7 is a circuit diagram of another prior art MOS transistor output circuit.
Figure 8:
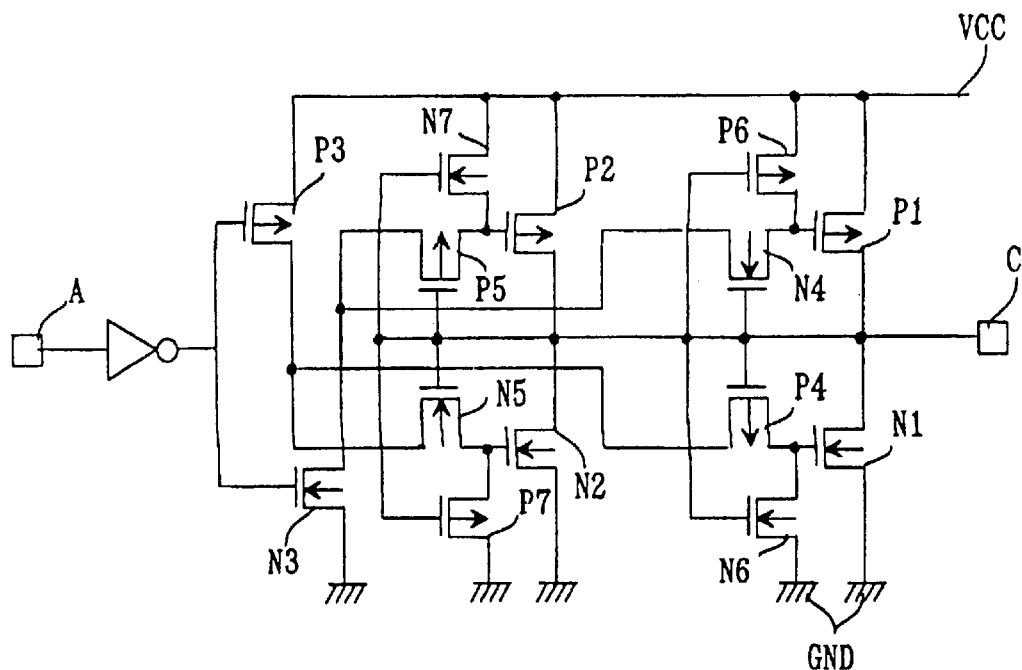
FIG. 8 is a circuit diagram of a further prior art MOS transistor output circuit.

A third embodiment of the present invention is next described. Some clock generator ICs for supplying clocks to CPUs use a 2.5-V power supply for an internal voltage supply of 3.3 V. The present invention can also be applied to this configuration. An example of this is now described by referring to FIG. 5. Note that like components are denoted by like reference numerals in both FIGS. 1 and 5. In this embodiment, the input terminal IN and the control circuit 3 are driven by a 3.3-V power supply. The output terminal OUT, the first and second p-channel MOS transistors 1P, 2P, the first and second n-channel MOS transistors 1N, and 2N are driven by a 2.5-V power supply. Also shown are level shifters L1, L2, and L3. The level shifter L1 lowers the level of a signal from the first detection portion 31 to a level that can be applied to the second p-channel MOS transistor 2P driven with the 2.5-V power supply. Similarly, the level shifters L2 and L3 lower the levels of signals from the first input terminal IN and the second detection portion 32, respectively, and supply the lowered signals to the first p-channel and n-channel MOS transistors 1P, 2N, and the second n-channel MOS transistor 2N.

In the present invention, none of the first and second detection portions require feedback from the output section and so they can be separated from the output section. Even if a low power-supply output of 2.5 V is used, the first and second detection portions can be operated reliably using the 3.3-V power supply. Hence, the advantages of the present invention described in connection with the first embodiment can be obtained reliably.

In a MOS transistor output circuit in accordance with the present invention, two MOS transistors are mounted as output transistors on each of p-channel and n-channel sides. Thus, the output transistors are separated. A certain signal corresponding to an input signal is applied to the gates of the first p-channel MOS transistor and the first n-channel MOS transistor. The falling edge of the input signal is detected to create a first signal. A period starting with the rising edge of the output signal and ending with the instant at which the logic level of the output signal can be regarded as high (H) is referred to as the first period. The second p-channel MOS transistor is held in conduction during the first period by the first signal. The rising edge of the input signal is detected to create a second signal. A period starting with the falling edge of the output signal and ending with the instant at which the logic level of the output signal can be regarded as low (L) is herein referred to as the second period. The second n-channel MOS transistor is held in conduction during the second period by the second signal. Consequently, noises such as ringing and ground bounces are suppressed. Therefore, a feedback portion can be eliminated from the output section. Thus, the MOS transistor output circuit can be operated at a higher speed under lower supply voltages.

What is claimed is:

1. A MOS transistor output circuit comprising:

a first p-channel MOS transistor having a drain;

a first n-channel MOS transistor having a drain connected with the drain of said first p-channel MOS transistor to form a first common drain;

a second p-channel MOS transistor having a drain;

a second n-channel MOS transistor having a drain connected with the drain of said second p-channel MOS transistor to form a second common drain;

an output terminal formed across said first and second common drains such that an output signal having a rising edge and a falling edge appears at said output terminal;

said first p-channel MOS transistor and said first n-channel MOS transistor having gates to which a certain signal corresponding to an input signal or an inversion of said input signal is applied, said input signal having a rising edge and a falling edge;

a first signal generation means for detecting the falling edge or the rising edge of said input signal and producing a first signal if said certain signal corresponds to said input signal or said inversion, respectively, said first signal being supplied to the gate of said second p-channel MOS transistor;

a second signal generation means for detecting the rising edge or the falling edge of said input signal and producing a second signal if said certain signal corresponds to said input signal or said inversion, respectively, said second signal being supplied to the gate of said second n-channel MOS transistor;

wherein said second p-channel MOS transistor is held in conduction during a first period beginning with the rising edge of said output signal and ending with an instant when the output signal can be regarded as having logic H level; and said second n-channel MOS transistor is held in conduction during a second period beginning with the falling edge of said output signal and ending with an instant when the output signal can be regarded as having logic L level.

2. The MOS transistor output circuit of claim 1, wherein delay of said certain signal with respect to said input signal is made substantially equal to delay of said first and second signals with respect to said rising or falling edge of said first input signal.

3. A MOS transistor output circuit comprising:

a first p-channel MOS transistor having a drain;

a first n-channel MOS transistor having a drain connected with the drain of said first p-channel MOS transistor to form a first common drain;

a second p-channel MOS transistor having a drain;

a second n-channel MOS transistor having a drain connected with the drain of said second p-channel MOS transistor to form a second common drain;

an output terminal formed across said first and second common drains such that an output signal having a rising edge and a falling edge appears at said output terminal;

said first p-channel MOS transistor and said first n-channel MOS transistor having gates to which a certain signal corresponding to an input signal or an inversion of said input signal is applied, said input signal having a rising edge and a falling edge;

a first signal generation means for detecting the falling edge or the rising edge of said input signal and producing a first signal if said certain signal corresponds to said input signal or said inversion, respectively, said first signal being supplied to the gate of said second p-channel MOS transistor, said first signal generation means comprising a first AND gate, a first inverter receiving said certain signal, a first delay inverter connected to said first inverter and a second inverter connected to said second p-channel MOS transistor, said first AND gate further comprising a first input terminal connected to said first inverter, a second input terminal connected to said delay inverter and an output terminal connected to said second inverter;

a second signal generation means for detecting the rising edge or the falling edge of said input signal and producing a second signal if said certain signal corresponds to said input signal or said inversion, respectively, said second signal being supplied to the gate of said second n-channel MOS transistor, said second signal generation means comprising a second AND gate and a second delay inverter receiving said certain signal, said second AND gate having a first input terminal receiving said certain signal, a second input terminal connected to said second delay inverter and an output terminal connected to said second n-channel MOS transistor;

wherein said second p-channel MOS transistor is held in conduction during a first period beginning with the rising edge of said output signal and ending with an instant when the output signal can be regarded as having logic H level; and said second n-channel MOS transistor is held in conduction during a second period beginning with the falling edge of said output signal and ending with an instant when the output signal can be regarded as having logic L level.

4. A MOS transistor output circuit comprising:

a first p-channel MOS transistor having a drain;

a first n-channel MOS transistor having a drain connected with the drain of said first p-channel MOS transistor to form a first common drain;

a second p-channel MOS transistor having a drain;

a second n-channel MOS transistor having a drain connected with the drain of said second p-channel MOS transistor to form a second common drain;

an output terminal formed across said first and second common drains such that an output signal having a rising edge and a falling edge appears at said output terminal;

said first p-channel MOS transistor and said first n-channel MOS transistor having gates to which a certain signal corresponding to an input signal or an inversion of said input signal is applied, said input signal having a rising edge and a falling edge;

a first signal generation means for detecting the falling edge or the rising edge of said input signal and producing a first signal if said certain signal corresponds to said input signal or said inversion, respectively, said first signal being supplied to the gate of said second p-channel MOS transistor, said first signal generation means comprising a first AND gate;

a second signal generation means for detecting the rising edge or the falling edge of said input signal and producing a second signal if said certain signal corresponds to said input signal or said inversion, respectively, said second signal being supplied to the gate of said second n-channel MOS transistor, said second signal generation means comprising a second AND gate;

wherein said second p-channel MOS transistor is held in conduction during a first period beginning with the rising edge of said output signal and ending with an instant when the output signal can be regarded as having logic H level; and said second n-channel MOS transistor is held in conduction during a second period beginning with the falling edge of said output signal and ending with an instant when the output signal can be regarded as having logic L level.

* * * * *